US005561379A

United States Patent [19]

Downey

[11] Patent Number: 5,561,379

[45] Date of Patent: Oct. 1, 1996

[54] REMOTE PLANAR CAPACITIVE SENSOR APPARATUS FOR A DIRECT IGNITION SYSTEM

[75] Inventor: Joel F. Downey, Kokomo, Ind.

[73] Assignee: Delco Electronics Corp., Kokomo, Ind.

[21] Appl. No.: 333,692

[22] Filed: Nov. 3, 1994

Related U.S. Application Data

[63] Continuation-in-part of Ser. No. 43,703, Apr. 8, 1993, Pat. No. 5,410,253.

[51] Int. Cl.[6] ............................ F02P 17/00; G01R 15/00

[52] U.S. Cl. ............................ 324/391; 324/402

[58] Field of Search ............................ 324/391, 392, 324/402, 126, 170, 260, 262, 393; 123/414–416; 73/116, 117.3; 29/602.1, 606

[56] References Cited

U.S. PATENT DOCUMENTS

| | | | |
|---|---|---|---|
| 2,517,976 | 8/1950 | Clarke | 340/579 |
| 2,523,017 | 9/1950 | Harrison | 340/632 |
| 2,560,734 | 7/1951 | Mouzon | 324/693 |
| 4,648,367 | 3/1987 | Gillbrand et al. | 123/425 |
| 4,862,093 | 8/1989 | Jiewertz | 324/464 |
| 5,317,267 | 5/1994 | Miyata et al. | 324/126 |
| 5,376,886 | 12/1994 | Shimasaki et al. | 324/402 |

*Primary Examiner*—Sandra L. O'Shea
*Assistant Examiner*—Jay M. Patidar
*Attorney, Agent, or Firm*—Mark A. Navarre

[57] ABSTRACT

Ignition events in a direct ignition system are sensed by capacitively coupling positive and negative ignition voltages generated by the secondary winding of the ignition transformer. A pair of planar conductive plates disposed remote from each of the secondary winding leads capacitively couple the ignition voltages to a common node to provide an input to a processing circuit for determination of absolute engine position. The secondary coil and leads are at least partially immersed in an epoxy potting material, which forms a dielectric through which the conductive plates are capacitively coupled to the respective coil leads. The plates are electrically coupled by a conductor to form a common node, which in turn is electrically coupled to a signal processing circuit. Conveniently, the plates and conductors are formed as a single leadframe element and insert molded in the polyester material. Also, the areas of the plates are relatively sized so that the capacitively coupled voltages are balanced, and the common node voltage is substantially zero prior to spark discharge.

7 Claims, 5 Drawing Sheets

REMOTE PLANAR CAPACITIVE SENSOR APPARATUS FOR A DIRECT IGNITION SYSTEM

This is a continuation-in-part of U.S. Pat. No. 5,410,253, issued Apr. 25, 1995.

BACKGROUND OF THE INVENTION

In prior art ignition systems, it is known to sense secondary ignition voltages for purposes of misfire detection by means of a probe or cylindrical conductor capacitively coupled to an ignition conductor in the secondary winding circuit. See, for example, the U.S. Pat. 5,376,886 to Shimasaki et al., and the patents referred to therein.

SUMMARY OF THE PRESENT INVENTION

The present invention is directed to a coil module for a direct ignition system having an integral ignition signal sensing device which provides signals that may be utilized in the method and apparatus claimed in the aforementioned patent.

According to this invention, the coil module includes a step-up transformer having a secondary coil with first and second leads for connection to first and second spark plugs, and first and second conductive plates disposed in proximity to the first and second coil leads. The secondary coil and leads are at least partially immersed in an epoxy potting material, which forms a dielectric through which the plates are capacitively coupled to the respective coil leads. In the illustrated embodiment, the dielectric also includes a glass-filled polyester material in which the conductive plates are molded and an air gap between the epoxy and polyester materials. The combination of the coil leads, dielectric materials and plates define a virtual parallel plate capacitor through which first and second polarity ignition voltages periodically present in the coil leads are sensed. The plates are electrically coupled by a conductor to form a common node, which in turn is electrically coupled via another conductor to processing circuitry in accordance with the aforementioned patent application. The module include is a pair of resistors, which in combination with the virtual capacitors, form a high pass filter network for providing an input signal for utilization by the processing circuitry. Conveniently, the plates and conductors may be formed as a single leadframe element and insert molded in the polyester material. Also, the areas of the plates may be relatively sized so that the capacitively coupled voltages are balanced, and the common node voltage is substantially zero prior to spark discharge.

The integral sensing device of this invention avoids the expense of discrete capacitors, which would have to be sized to withstand normal ignition voltage transients. Additionally, no soldered connections are required, and the inclusion of the plates in the leadframe assembly minimizes their cost as well.

DETAILED DESCRIPTION OF THE DRAWINGS

Figure 1:
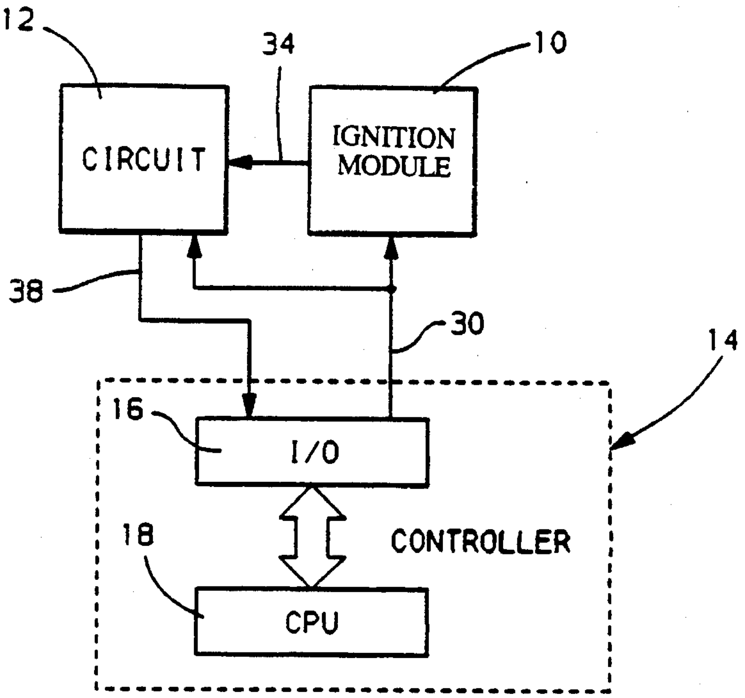
FIG. 1 is a DIS block diagram including an ignition coil module, a processing circuit and a controller.

Referring to FIG. 1, a controller 14, which may be a conventional single chip microcontroller having input/output means I/O 16 and central processing unit CPU 18, electrically communicates a spark command to ignition module 10 and to processing circuit 12 via line 30. The ignition module 10 is part of a direct ignition system (DIS) in which two spark plugs are driven by the module 10, as will be detailed in the description of the circuit of FIG. 2.

The ignition module 10 provides an output signal to processing circuit 12 via line 34. The output signal includes a periodic positive going transient voltage and a periodic negative going transient, which are interpreted by the circuit 12 to form an output signal on line 38 back to controller 14 indicating the occurrence of cylinder events, such as the occurrence of a combustion event in a predetermined cylinder. Circuit 12 is detailed in FIG. 4, to be described. The signal on line 38 may be used by controller 14 in a determination of absolute engine position by relating the detected event to an absolute engine angle in an engine operating cycle. In a manner generally understood in the art of engine control and diagnostics, the absolute position determination may be used to synchronize relative engine position signals, such as signals from an engine crankshaft position sensor (not shown).

Figure 2:
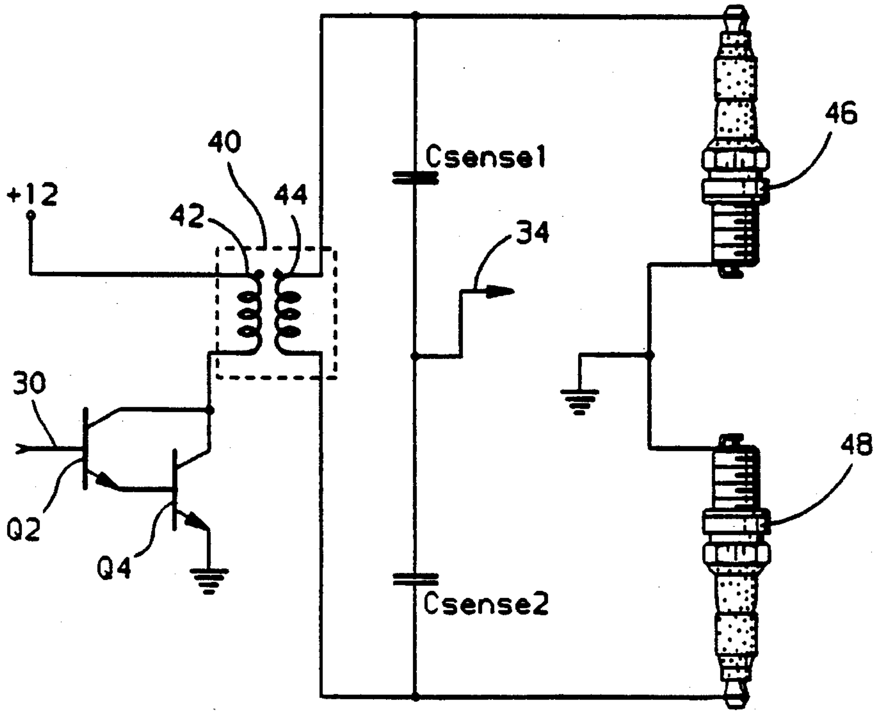
FIG. 2 is schematically illustrates the ignition coil module of FIG. 1, including an equivalent circuit representation of the integral ignition signal sensing apparatus of this invention.

The ignition module 10 is schematically depicted in FIG. 2, wherein a conventional step-up transformer 40, including primary coil 42 and secondary coil 44 is driven by a Darlington transistor pair, including transistors Q2 and Q4, controlled by a spark command on line 30, connected to the base of Q2. The high side of the primary coil 42 is connected to a supply voltage, set at approximately twelve volts from a twelve volt battery (not shown) in this embodiment, such that when spark command on line 30 is high, as illustrated by the signal 60 in FIG. 3, Darlington pair Q2 and Q4 will be conducting from the low side of primary coil 42, and the current through primary coil 42 will be charging up.

When the spark command on line 30 drops low, the collapsing magnetic field caused by the interrupted current in the primary 42 drives up the voltage across the secondary coil 44. Secondary capacitance in the circuitry connected to secondary coil 44 slows the rise in voltage across the secondary 44, as is generally understood in the art of ignition control. The voltage will continue to rise until reaching the breakdown voltage across the cathode to anode gap of spark plugs 46 and 48. Current will discharge across the gap of the spark plugs 46 or 48 when their respective breakdown voltage is reached, as is generally understood in the art.

Spark plug 46 is disposed in a first cylinder, such as cylinder number one, and spark plug 48 is disposed in a second cylinder, such as cylinder number four of an internal combustion engine (not shown). The discharge from coil 44 across the cathode to anode gap of spark plug 48 will be of negative voltage polarity as illustrated by the signal 62 of FIG. 3, and the discharge across the cathode to anode gap of spark plug 46 will be of positive voltage polarity, as illustrated in signal 64 of FIG. 3.

Figure 3:
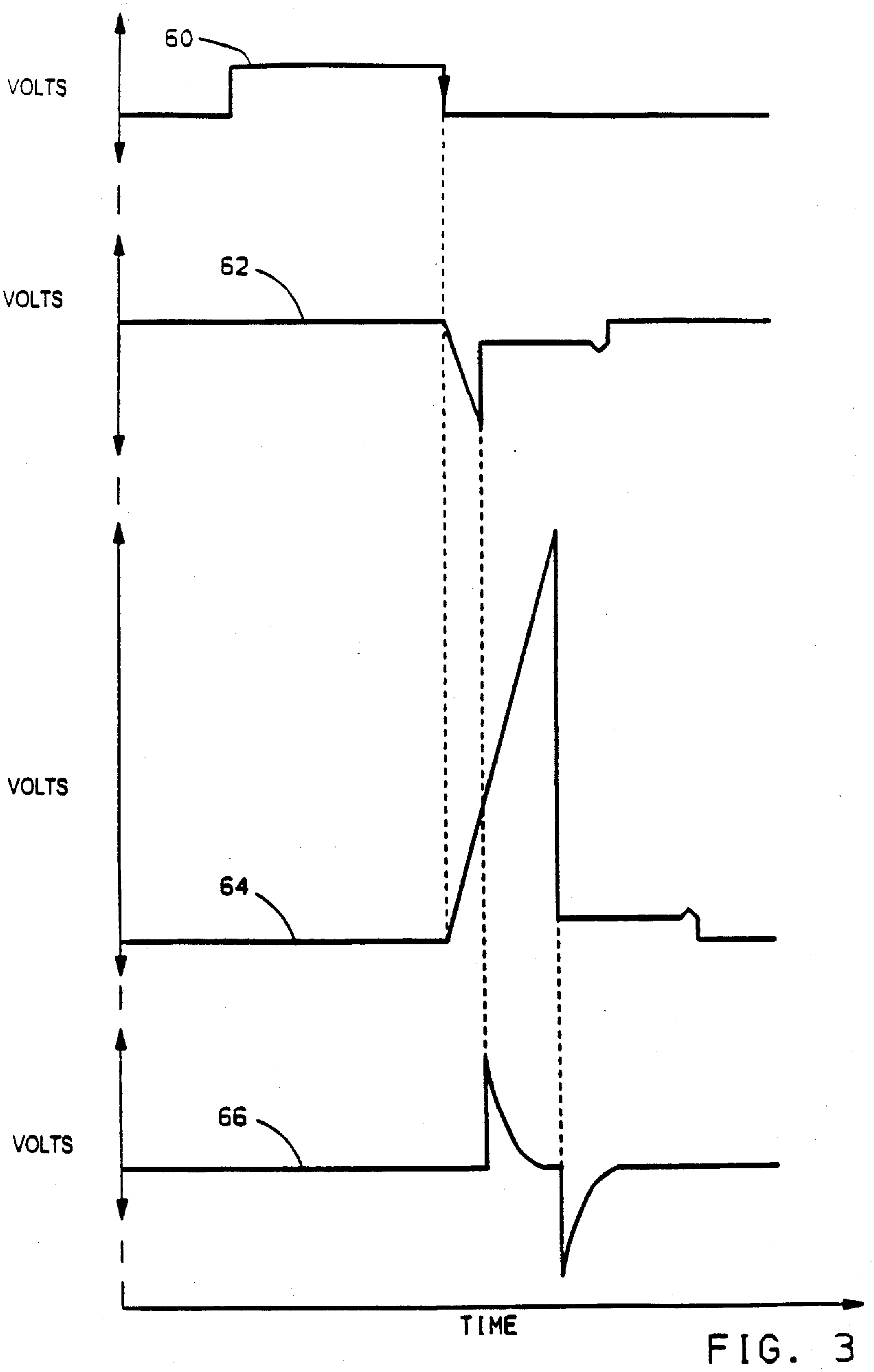
FIG. 3 is a timing diagram depicting representative ignition signals sensed by the sensing apparatus of FIG. 2.

In accord with conventional ignition systems wherein a single spark command drives multiple spark plugs, such as in direct ignition systems, the signal, such as signal 60 in FIG. 3, will be issued to the circuit of FIG. 2 when either spark plug 46 or 48 is to be fired. In a direct ignition system, such as that of this embodiment, when one of the plugs 46 or 48 is to be fired, one of the corresponding cylinders will be in its compression stroke at high pressure and the other will be in a lower pressure stroke, such as the exhaust stroke with its exhaust valves open.

It is generally understood by those skilled in the art of ignition control that a relationship of direct proportionality exists between cylinder pressure magnitude and the magnitude of the breakdown voltage across a given spark plug gap. For example, in a direct ignition system, the spark plug in a cylinder undergoing a compression event required a significantly higher voltage across its gap for breakdown than does its counterpart spark plug in a cylinder undergoing a lower pressure exhaust event. As the two plugs share a common source of ignition energy in a direct ignition system, namely the secondary coil 44 (FIG. 2), the spark plug in the high pressure cylinder will require more time to reach its breakdown voltage than will the plug in the lower pressure cylinder. A factor in the magnitude of this time difference is the amount of capacitance in the drive circuitry including the secondary coil 44 and the spark plugs, as this capacitance reduces the rate at which voltage from the secondary charges up across each of the spark plugs 46 and 48, as described.

Experimentation has demonstrated that this time difference between breakdown of the pair of plugs is measurable. Accordingly, analysis of the time relationship of the discharge ignition voltage across pairs of spark plugs in such systems provides direct information on which plug and thus which cylinder is in its compression, or alternately, its exhaust stroke. The absolute angular position of the engine may be derived therefrom by relating the detected cylinder event to absolute engine position.

Furthermore, as the voltage across pairs of spark plugs driven by a common ignition source in a direct ignition system are of known opposite polarity, the analysis of the time relationship may be simplified by analyzing the time relationship between positive and negative ignition signals in a single circuit. For example, signals 62 and 64 in FIG. 3 illustrate transient voltages across the gaps of two plugs having a single drive coil in a direct ignition system. Signal 62 illustrates the voltage across the gap of a plug with an electrical connection of negative polarity, such as plug 48 in FIG. 2, and signal 64 illustrates the voltage across the gap of a plug with an electrical connection of positive polarity, such as plug 46 in FIG. 2.

While the voltage across the two gaps starts to increase in magnitude substantially contemporaneously as is seen with signals 62 and 64 of FIG. 3, the plug of negative electrical polarity reaches its relatively low breakdown voltage more quickly, as it is in a relatively low pressure exhaust stroke, and the plug of positive polarity requires significantly more time to reach its high breakdown voltage as it is in the relatively high pressure compression or power stroke in its cycle. Signal 66 of FIG. 3 illustrates a coupled signal containing information on the temporal relationship between the signals 62 and 64, for example as may be used in a determination of engine absolute position.

Figure 4:
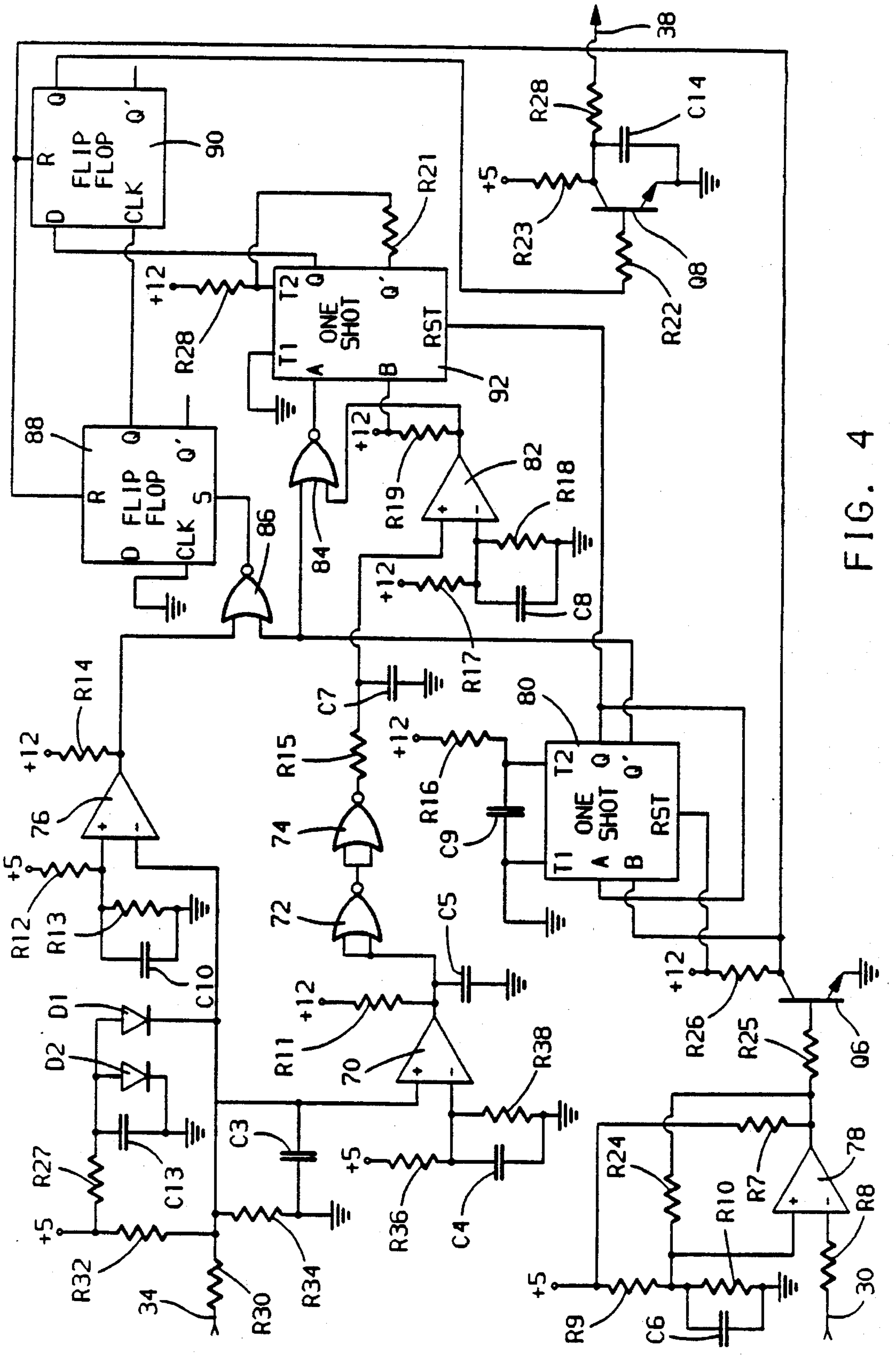
FIG. 4 is a circuit diagram of the processing circuit of FIG. 1.

The ignition voltages are capacitively coupled to the processing circuit 12 of FIG. 4 as schematically depicted by the equilavent circuit capacitors Csense1 and Csense2 in FIG. 2. The individual ignition signals are coupled to a common node 35 to form a composite signal on line 34 which is provided as an input to the processing circuit 12.

Figure 5:
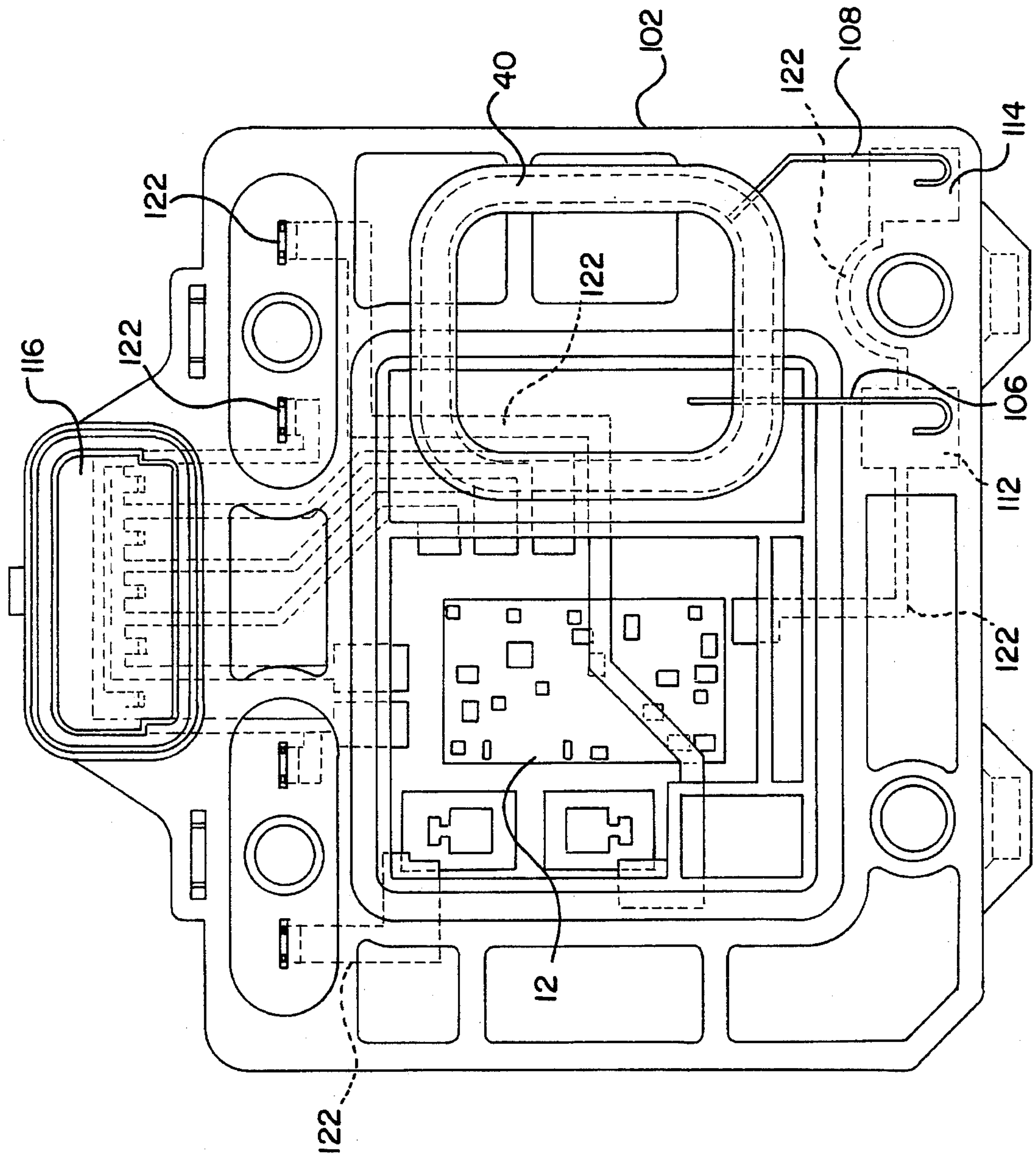
FIG. 5 is a top view of an ignition coil module in accord with this invention.
Figure 6:
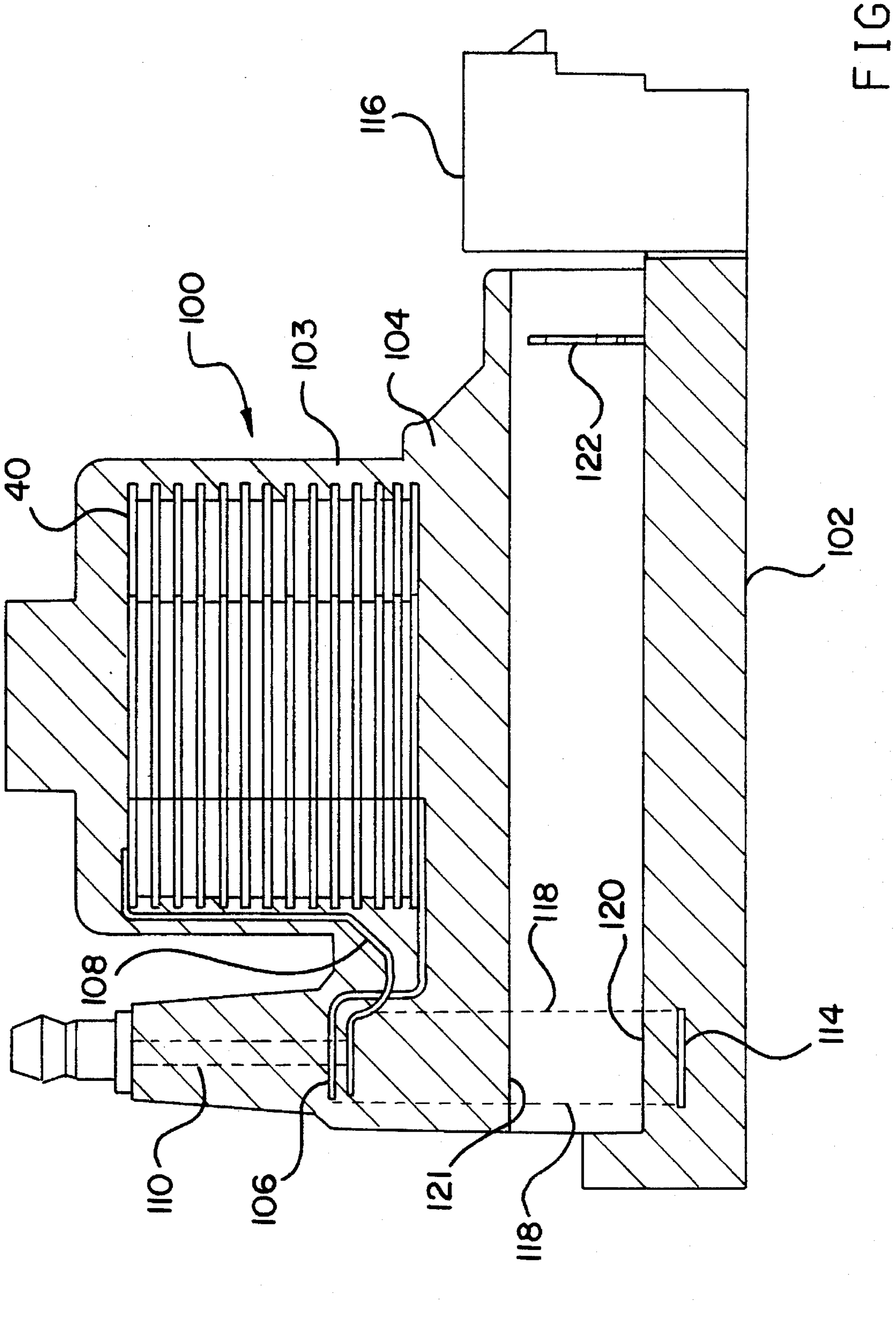
FIG. 6 is a partial cross sectional and outline view of the ignition coil module of FIG. 5.

According to this invention and as explained in more detail in reference to FIGS. 5–6, the capacitors Csense1 and Csense2 are defined by a pair of conductive plates 112, 114 disposed in proximity to the two ends 106, 108 of secondary coil 44. The values of Csense1 and Csense2—and therefore, the size and location of the conductive plates—are selected so that the voltage at common node 35 is of a magnitude which is easily distinguishable from noise, but which will be non-destructive to the processing circuit 12.

Additionally, the values of Csense1 and Csense2 are selected in order that only the high speed voltage transients accompanying spark discharge appear at common node 35. This consideration is influenced by differences in spark plug wire lengths and stray capacitances. In each sensor leg, the capacitively coupled current I may be determined according to the expression:

$$I=C\ dv/dt$$

where C is the effective capacitance of Csense1 or Csense2, and dv/dt is the change in the respective secondary coil ignition voltage with respect to time. Given this relationship, the size and location of the conductive plates which define Csense1 and Csense2 are selected so as to balance the sensor leg currents—and therefore minimize the voltage at common node 35—prior to the occurrence of the respective spark events. This may be achieved by determining the typical dv/dt occurring in each of the secondary coil circuits and sizing the conductive plates to provide capacitance in inverse proportional relationship to the i observed dv/dt's.

Ignition voltage transients of sufficiently high speed will be reflected across the equivalent circuit Csense1 and Csense2 formed by and between the first and second plates 112, 114 and the high and low sides of the secondary coil 44. Line 34 includes a resistive path to ground, to be described. As such, a high pass filter is formed by the capacitance of Csense1 and Csense2 and resistive path, wherein only the high speed transients across the spark plug gaps are passed to line 34. For instance, the high speed transient from the negative voltage peak toward zero volts is passed across Csense2 to line 34 in the form of a rapid voltage change in the positive direction. Conversely, the high speed transient from the positive peak toward zero volts is passed across Csense1 to line 34 in the form of a rapid voltage change in the negative direction.

FIG. 3 depicts representative time-related signals for the circuit of FIG. 2, assuming that the spark plug 48 (having negative polarity) fires during an exhaust stroke, while the spark plug 46 (having positive polarity) fires during a compression stroke. A spark plug firing during an exhaust stroke is referred to as a waste spark, while a spark plug firing during a compression stroke is referred to as a non-waste spark. Signal 60 represents a control signal applied to transistor Q2 at the initiation of an ignition period. Signals 62 and 64 represent the individual ignition voltages developed at Csense1 and Csense2, respectively. During the period of the control signal 60, current builds up in the primary winding 42, but does not cause sufficient dv/dt at either secondary coil lead to result in appreciable detected ignition voltage signals 62, 64. When the control signal is terminated and the primary coil current collapses, significant dv/dt's occur at both secondary coil leads, resulting in the ignition voltage signals 62 and 64. The magnitude of the ignition voltage 64 is depicted as substantially larger than that of ignition voltage 62 since the voltage 64 results from a waste spark, while the voltage 64 results from a non-waste spark.

In general, the circuit of FIG. 4 diagnoses the non-waste spark in cylinder four by determining when the ignition signal sensed on line 34 of FIG. 4 of negative polarity occurs before the ignition signal on line 34 of positive polarity. When a non-waste spark is detected in cylinder four, the circuit of FIG. 4 outputs a falling edge signal on line 38. The falling edge is received by controller 14, such as by a conventional input capture port in input/output I/O unit 16, and the time of the falling edge is stored for conventional engine synchronization purposes, for example in a manner analogous to the synchronization using a conventional signal from a camshaft position sensor (not shown).

The specific interconnection of the elements that make up the processing circuit 12 are illustrated in FIG. 4. The signal from line 34 is passed to ground through resistors R30 and R34, forming a high pass filter as described above in reference to FIG. 2. A bias adjusting circuit including resistors R32 and R34, both set at twenty kilo-ohms, ohms, increase the bias point of the coupled ignition signal to approximately 2.5 volts, so that both sensed ignition signals will be above zero volts and yet will be distinguishable. A clamping circuit including twenty kilo-ohm resistor R27, 0.1 micro-Farad capacitor C13, and diodes D1 and D2 is connected to the bias adjusted signal, to clamp negative transients.

Filtering capacitor C3 set at 20 pico-Farads is connected between the bias adjusted signal and ground to decrease the slope of the signal edges by passing high frequency transients to ground, thereby widening the pulse duration. The input signal on line 34, having been bias adjusted, clamped and filtered, is passed to two comparators 70 and 76. Specifically, it is passed to the non-inverting input of comparator 70, and to the inverting in put of comparator 76.

The inverting input of comparator 70 is fixed at approximately one volt by dividing down a five volt voltage supply signal via voltage divider formed by 40 kilo-ohm resistor R36, 10 kilo-ohm resistor R38, and 0.1 micro-Farad filtering capacitor C4. The non-inverting input of comparator 76 is set at approximately 4.0 volts by dividing down a five volt supply signal via voltage divider formed by 10 kilo-ohm resistor R12, 40 kilo-ohm resistor R13, and 0.1 micro-Farad filtering capacitor C10.

Accordingly, the output of comparator 70 will be biased high, and will remain high until a low voltage ignition transient from a discharge across the gap of spark plug 46 (FIG.2) is provided on line 34, driving the non-inverting input of comparator 70 to substantially less than one volt. The comparator 70 output will remain low until the spark plug transient has passed, approximately 0.5 microseconds in this embodiment, and then will return high.

The high output from comparator 70 is passed through pulse extending circuitry, including 100 kilo-ohm resistor R11 and 220 pico-Farad capacitor C5, wherein when output of comparator 70 switches high, the signal out of the pulse stretching circuitry will rise at an exponential rate as C5 charges up to the high level. This delayed rising edge is passed successively to NOR gates 72 and 74, connected in series as signal level inverters.

The output of the NOR gates 72 and 74 is a squared version of the pulse stretching circuitry output having a rising edge delayed by the amount of time required for the exponential voltage rise from the pulse stretching circuitry to cross the threshold of the NOR gate 72. In this embodiment, the rising edge of the signal is delayed through the NOR gates by approximately fifteen microseconds from the time of the rising edge of comparator 70. Of course, the falling edge of the signal out of comparator 70 is not delayed by the pulse stretching circuitry or by the NOR gates.

Output of NOR gate 74 is passed through first order filter including ten kilo-ohm resistor R15 and 100 pico-Farad capacitor C7, having a time constant equal to the product of R15 and C7, approximately one microsecond, to delay the edges of the NOR gate 74 output. The filter output is passed to the non-inverting input of comparator 82. The inverting input of comparator 82 is connected to a predetermined threshold voltage of approximately 4.4 volts, or the supply voltage of approximately twelve volts divided by the constant e, which is generally known to be about 2.7. This voltage setting is provided via a conventional voltage divider including 12.7 kilo-ohm resistor R17, 7.3 kilo-ohm resistor R18, and a voltage supply signal of approximately twelve volts.

Transitions at the output of NOR gate 74 will thus be delayed by one time constant of the filter formed by R15 and C7 before appearing at the output of comparator 82. Sensitivity of this delay to variations in supply voltage is decreased by dividing down the supply voltage via this divider circuit at the inverting input to comparator 82. Conventional filtering on the signal through the divider circuitry is provided by 0.1 micro-Farad capacitor C8. Comparator 82 output is high when the output of NOR gate 74, delayed by the first order filter exceeds approximately 4.4 volts, and comparator output is low otherwise.

In this embodiment, comparator 82 output is thus a delayed version of the detected negative going ignition transient on line 34, with a delay of approximately 1.5 microseconds, one microsecond of which is provided by the first order filter including R15 and C7, and the other 0.5 microseconds of which is due to circuit propagation delays. Comparator 82 output is pulled up through resistor R19, set at ten kilo-ohms, and passed as an input to two-input NOR gate 84.

Returning to comparator 76, this comparator output is low when a positive ignition voltage transient is detected that exceeds its four volt non-inverting input. Such a transient is detected in this embodiment when Csense2 passes a positive going ignition transient, as described. Otherwise, comparator 76 output is high. Comparator 76 output is pulled up via ten kilo-ohm resistor R14 and is passed as an input to two-input NOR gate 86.

The second input to both NOR gates 84 and 86 is an output Q' from conventional one-shot 80. Generally, this one-shot fires for approximately 100 microseconds after the falling edge of the spark command, such as the falling edge of the signal 60 in FIG. 3, which starts the charge-up of the voltage across the gap of spark plugs 46 and 48 of this embodiment, as described. The one-shot firing thus provides approximately a 100 microsecond window in which to analyze the ignition transient, as will be described.

Specifically, the spark command on line 30 is input to the inverting input of comparator 78 through resistor R8, set at 51 kilo-ohms. R8 is provided to limit loading on the spark command line. A voltage level is provided to the non-inverting input of comparator 78 via a voltage divider including twenty kilo-ohm resistor R9 and ten kilo-ohm resistor R10. Comparator input filtering is provided by 0.001 micro-Farad capacitor C6. The voltage level at the non-inverting input to comparator 78 should be set to the spark command threshold level, below the voltage level on line 30 during ignition dwell periods and above the voltage level on line 30 during non-dwell periods.

Conventional comparator threshold hysteresis is provided in this embodiment by connecting resistor R24 of 25 kilo-ohms between the comparator output and its non-inverting input. As such, the comparator 78 output will be low when the spark command input from line 30 exceeds approximately 2.3 volts, but will not be driven high unless the input from line 30 drops below approximately 1.3 volts, which generally decreases the sensitivity of comparator 78 to input noise.

The output of comparator 78 is high when the spark command is low, and the output is low during the ignition dwell period, when the spark command is high. The comparator output is pulled up via 4.7 kilo-ohm resistor R7, and is passed through 47 kilo-ohm resistor R25 to inverting transistor Q6. The output of the inverter Q6 is pulled up to supply voltage of twelve volts via ten kilo-ohm resistor R26, and is passed to the reset input R of conventional D flip-flop 90, to be described, to the reset input R of conventional D flip flop 88, to be described, and to input B of one-shot 80.

The conventional one-shot 80 provides a window around the ignition events of interest, during which time analysis and temporal comparison of the positive and negative ignition transients from the pair of spark plugs 46 and 48 may be made. Specifically, when the spark command line 30 drives the active low input B to the one-shot 80 low, which is at the end of the dwell period when the voltage across the gap of the two spark plugs 46 and 48 starts to charge up to the respective breakdown voltages, the one-shot output Q is driven high, and the inverted one-shot output Q' goes low.

Q' is provided to NOR gates 84 and 86, gating the other input to the NOR gates through to the respective NOR gate outputs. This gating through of the NOR gate inputs continues for the period of the one-shot 80, set at approximately 100 microseconds in this embodiment by connecting 0.01 micro-Farad capacitor C9 and ten kilo-ohm resistor R16 to the one-shot as illustrated in FIG. 4, in accord with generally known applications of one-shot circuit elements.

During this active period of one-shot 80, the output of comparator 76 is gated through as a set input S to D flip flop 88. The output Q of flip flop 88 is provided as a clock input CLK to D flip flop 90, wherein CLK is active on a rising edge. Accordingly, in a critical part of this embodiment of the invention, during the period of one-shot 80, the state of the input D to flip flop 90 will be gated through to its output Q when the output of comparator 76 switches from high to low, which is at the approximate time a positive ignition transient is detected at input line 34.

During this active period of one-shot 80, the output of comparator 82 is gated through as input A to one-shot 92. The other input B to one-shot 92 is active low, and is disabled by connecting it to a positive voltage source, such as a twelve volt source. The output Q of one-shot 92 is connected as the data input D to flip flop 90. One-shot 92 is connected in a configuration wherein it functions as a conventional set-reset flip flop, where the active high set input is A, the active low set input is B which is disabled in this embodiment, the reset input is the one-shot reset input RST, timer input T1 is grounded, timer input T2 is pulled up through resistor R20, set at 200 kilo-ohms, and the inverted output Q' is tied to T2 through resistor R21 set at 10 kilo-ohms.

Functionally, output Q of one-shot 92 will be driven high when the output of comparator 82 is driven low during the 100 microsecond window period of one-shot 80. The output Q of one-shot 92 will return low at the end of the window period, when the output Q of one-shot 80 drops low, activating the active low one-shot reset RST input. The output of NOR gates 86 and 88 will also drop low at the end of the window period, blocking propagation of signals from line 34 through to the output of the NOR gates.

Therefore, the data input D to flip flop 90 will remain low until approximately 1.5 microseconds after a negative ignition transient is detected on line 34, indicating ignition at the cylinder one spark plug. The output Q of flip flop 90 will thus be high if the negative transient on line 34, indicating ignition in cylinder one, occurs over 1.5 microseconds before the positive ignition transient indicating cylinder four ignition. Such a temporal relationship between the negative and positive transients on line 34 would indicate that cylinder one is in its exhaust stroke and cylinder four is in its compression stroke, as described. Alternatively, the output of flip flop 90 will be low if ignition in cylinder one occurs within 1.5 microseconds of ignition in cylinder four, or after ignition in cylinder four. The output Q of flip flop 90 will be reset to zero at the start of the next dwell period, as its reset pin R will be activated by the high output of inverting transistor Q6. The high output of Q6 will also reset flip flop 88 via its reset input R.

A high output Q of flip flop 90 will be used for synchronization in controller 14 and a low output will be ignored by the controller. The time offset between the transients provided by the circuit of FIG. 4, wherein the negative transient from cylinder one is delayed by approximately 1.5 microseconds before being compared to the time of the transient from cylinder four, compensates for expected time variations between the detected ignition events in the two cylinders under analysis, such as cylinders one and four in this embodiment. The time relationship between the two events may not, unless compensated, be easily distinguished, for example, when the events occur substantially at the same time, or when the waste spark event occurs after the non-waste event. In some applications, there are engine operating ranges wherein the waste spark event may occur a very short period of time after the non-waste event. The relative pressure in the two cylinders under analysis at the time of ignition, the secondary capacitance of the circuit of FIG. 2, and the engine operating point at the time of ignition all affect this time relationship between spark events. Analysis of the time relationship between the two ignition events for the specific application should be made to determine the extent of such timing variations. The delay imposed between the two signals before they are compared should then be set slightly larger in magnitude than the expected amount of time by which the waste spark signal could occur after the non-waste signal, such as the 1.5 microseconds of the present embodiment.

By setting an appropriate delay as described, the circuit of FIG. 4 will only generate synchronization information when ignition in the compressing cylinder clearly lags ignition in the exhausting cylinder. Such information reliably indicates engine absolute position despite the expected minor variations in the temporal relationship between the transients. In other embodiments of this invention, the delay may be adjusted, or eliminated entirely.

Returning to flip flop 90, the output Q is provided to the base of inverting transistor Q8 through ten kilo-ohm resistor R22. The collector of Q8 is pulled up to five volts through one kilo-ohm resistor R23, and the emitter is tied to ground. The output of the inverting transistor Q8 is filtered via capacitor C14 set at 0.001 micro-Farads, and buffered via 500 ohm resistor R28 to output line 38, which is connected to controller 14 (FIG. 1), as described. The time of the occurrence of a falling edge on line 38 is interpreted by controller 14 as the time of a compression stroke in a predetermined cylinder, such as cylinder four in this embodiment, or equivalently, as the time of the exhaust stroke in a predetermined cylinder, such as cylinder one in this embodiment.

FIGS. 5 and 6 are top and partial side/outline views of an ignition coil assembly according to this invention. In the illustrated embodiment, the assembly comprises multiple modules. The transformer module 100—one for each pair of spark plugs—houses the transformer 40 and mounts on a base module 102. As indicated in FIG. 6, the transformer windings are mounted in a housing 103 and then sealed with a curable potting material 104. The positive and negative polarity leads 106, 108 of the secondary winding 44 extend laterally from transformer 40 as shown for connection to positive and negative spark plug terminal posts 110 to which the spark plug wires are connected.

The base module houses the processing circuit 12 and ignition signal sensor plates 112, 114, and electrically interfaces the circuit 12 to the sensor plates 112, 114, the transformer modules 100, and controller 14 (via connector 116). The electrical interfacing within base module 102 is provided by an array of conductive lead frame elements 124 insert molded within the base module 102. In the manufacturing process, a number of pins hold the elements 122 and the sensor plates 112, 114 in place in a mold while the base module housing material (glass-filled polyester) is injected into the mold under high pressure. The pins are retracted before the polyester fully solidifies, so that the polyester can flow into and fill the holes left by the pins.

When the transformer module 100 is mounted on the base module 102, the sensor plates 112, 114 are vertically aligned with the secondary coil leads 106, 108, respectively. As best seen in FIG. 6, secondary winding lead 108 is separated from the sensor plate 114 by the molding material of base module 102, the air between the base 102 and transformer module 100, and the potting material 104 of transformer module 100, Although the plate 112 is obscured by the plate 114 in the side/outline view of FIG. 6, the plate 112 is similarly oriented with respect to the secondary winding lead 106. As such, the capacitive coupling between each plate 112, 114 and its respective coil lead 106, 108 is due to the combined effect of three virtual capacitances, effectively connected in series in FIG. 6, the vertical projection of sensor plate 114 is indicated by the dashed lines 118. The first capacitance is formed between the respective sensor plate 112, 114 and the air/polyester interface 120. The second capacitance is formed between the air/polyester interface 120 and the air/epoxy interface 121, within the area defined by the vertical projection of the respective sensor plate. The third capacitance is formed between the air/epoxy interface 121 (within the area defined by the vertical projection of the respective sensor plate) and the respective secondary winding lead 106, 108. The first two capacitances are equivalent parallel plate capacitors, while the third capacitor is an equivalent wire/plate capacitor.

In the manner set forth above, the coil assembly of this invention provides an inexpensive apparatus for sensing ignition voltages associated with spark discharge in a direct ignition system. The ignition voltages are useful, at least for determining the temporal relationship among the spark events produced by a single secondary coil, which is turn may be used to obtain absolute engine position information from a relative engine position signal. While this invention has been described in reference to the illustrated embodiment, it is not to be taken as limiting or restricting the invention since many modifications may be made through the exercise of skill in the art without departing from the scope of the invention.

The embodiments of the invention in which a property or privilege is claimed are described as follows:

1. A direct ignition apparatus comprising:

a transformer module including a transformer encased in potting material, said transformer having a secondary coil which develops an ignition voltage at a positive lead thereof;

spark generating means coupled to said positive lead for producing a spark discharge in a cylinder of an internal combustion engine;

a base module mated to said transformer module, said base module housing a planar conductive plate oriented in alignment with at least a portion of said positive lead and an ignition signal processing circuit electrically connected to said conductive plate to sense a voltage transient capacitively coupled to said conductive plate from said positive lead during said spark discharge.

2. A direct ignition apparatus as set forth in claim 1, wherein said base module is formed of plastic material, and said conductive plate is insert molded into said plastic material.

3. A direct ignition apparatus as set forth in claim 2, wherein said ignition signal processing circuit is mounted in a cavity formed in said plastic material of said base module, and said conductive plate forms an integral part of a conductive lead frame insert molded in said plastic material, electrically connecting said ignition signal processing circuit to said conductive plate.

4. A direct ignition apparatus comprising:

a transformer including a secondary coil which develops concurrent positive and negative ignition voltages at positive and negative leads thereof;

first spark generating means coupled to said positive lead for producing a first spark discharge in a first cylinder of an internal combustion engine;

second spark generating means coupled to said negative lead for producing a second spark discharge in a second cylinder of said internal combustion engine, a first planar conductive plate disposed remote from said positive and negative leads and oriented in parallel relationship to at least a portion of said positive lead;

a second planar conductive plate disposed remote from said positive and negative leads and oriented in parallel relationship to at least a portion of said negative lead, dielectric material disposed between said positive lead and said first conductive plate, and between said negative lead and said second conductive plate, and an ignition signal processing circuit connected to said first and second conductive plates to sense voltage transients capacitively coupled to said first and second conductive plates during said first and second spark discharges, respectively.

5. A direct ignition apparatus as set forth in claim 4, wherein said ignition signal processing circuit and said first and second conductive plates are housed in a plastic base module, said ignition signal processing circuit is mounted in a cavity formed in said base module, and said first and second conductive plates form an integral part of a conductive lead frame which is insert molded in the plastic, electrically connecting said ignition signal processing circuit to said first and second conductive plates.

6. A direct ignition apparatus as set forth in claim 4, including means for electrically coupling said first and second plates to form a common electrical node which is connected to said ignition signal processing circuit.

7. A direct ignition apparatus as set forth in claim 6, wherein the rate of change in voltage of the positive and negative ignition voltages prior to said first and second spark discharges are different due to an impedance mismatch between said first and second spark generating means, and the first and second planar conductive plates are differentially sized in relation to said impedance mismatch so as to balance the voltage transients capacitively coupled into said first and second plates prior to said first and second spark discharges, whereby the voltage at said common electrical node is substantially zero prior to said first and second spark discharges.

* * * * *